(12) United States Patent
Becker

(10) Patent No.: US 7,148,682 B2
(45) Date of Patent: Dec. 12, 2006

(54) APPARATUS FOR SENSING THE PROXIMITY OF A VEHICLE TO AN OBJECT

(75) Inventor: David L. Becker, White Lake, MI (US)

(73) Assignee: TRW Automotive U.S LLC, Livonia, MI (US)

( * ) Notice: Subject to any disclaimer, the term of this patent is extended or adjusted under 35 U.S.C. 154(b) by 0 days.

(21) Appl. No.: 11/071,358

(22) Filed: Mar. 3, 2005

(65) Prior Publication Data

US 2006/0197521 A1 Sep. 7, 2006

(51) Int. Cl.
  *G01B 7/14* (2006.01)
  *G01R 33/07* (2006.01)
(52) U.S. Cl. .................................. 324/244; 324/207.2
(58) Field of Classification Search ................ 324/244, 324/207.2
  See application file for complete search history.

(56) References Cited

U.S. PATENT DOCUMENTS

| | | | |
|---|---|---|---|
| 5,229,975 A | 7/1993 | Truesdell et al. | |
| 6,095,555 A | 8/2000 | Becker et al. | |
| 2004/0246112 A1* | 12/2004 | Strumolo et al. | 340/435 |
| 2004/0249584 A1* | 12/2004 | Gibb et al. | 702/52 |
| 2005/0154503 A1* | 7/2005 | Jacobs | 701/1 |

* cited by examiner

*Primary Examiner*—Bot LeDynh
(74) *Attorney, Agent, or Firm*—Tarolli,Sundheim, Covell&Tummino LLP

(57) ABSTRACT

An apparatus for sensing the proximity of a first vehicle (79) to an object such as a second vehicle (82). The apparatus includes an array of sensor assemblies (80) mounted on the first vehicle (79). The sensor assemblies (80) include Hall effect sensors (184). The array of sensor assemblies (80) provide an output signal when located within the proximity of the second vehicle (82).

3 Claims, 6 Drawing Sheets

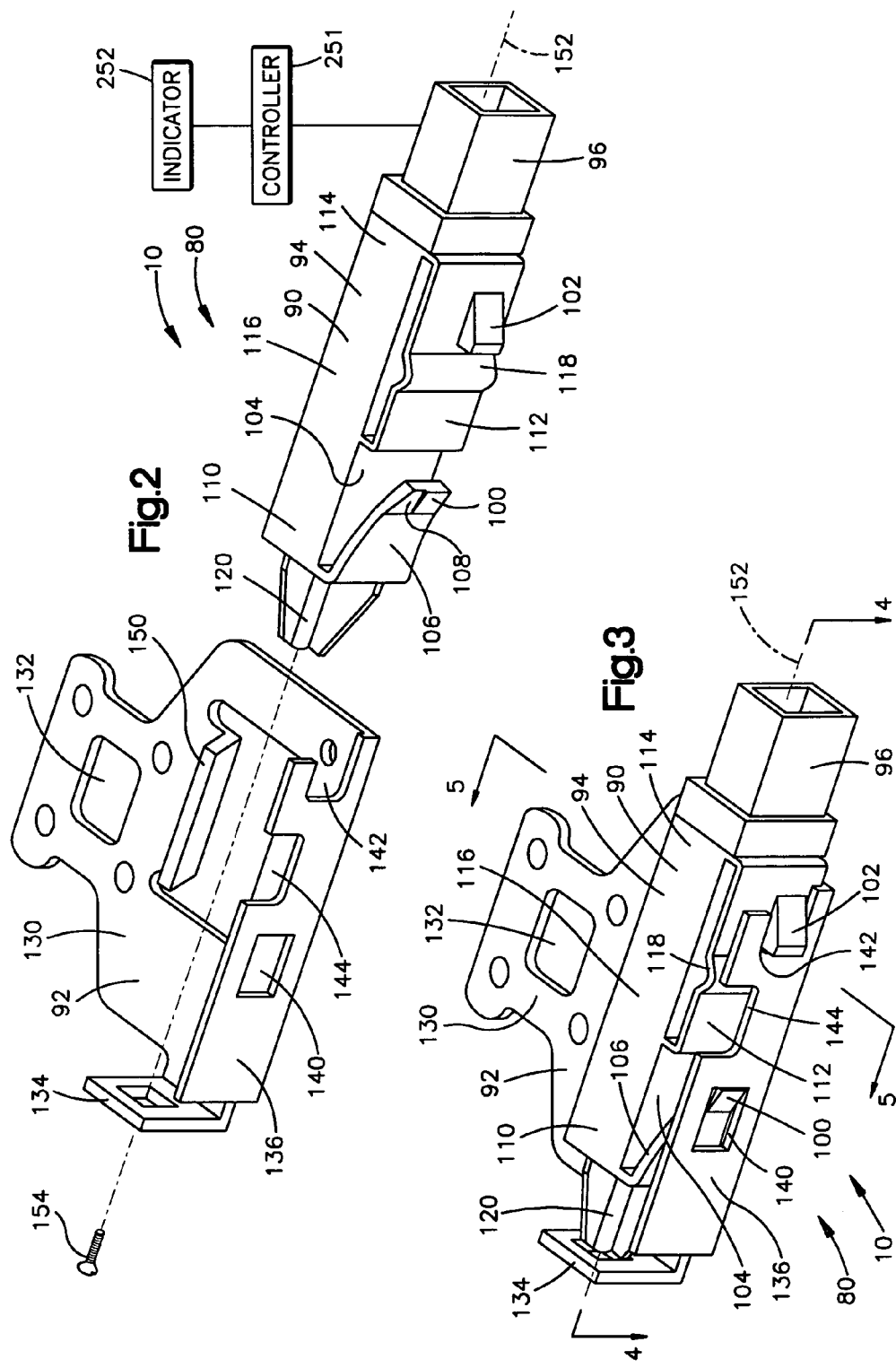

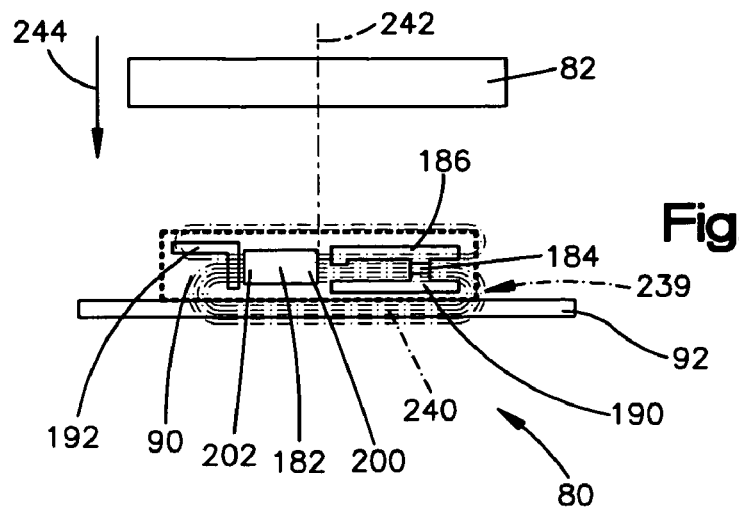
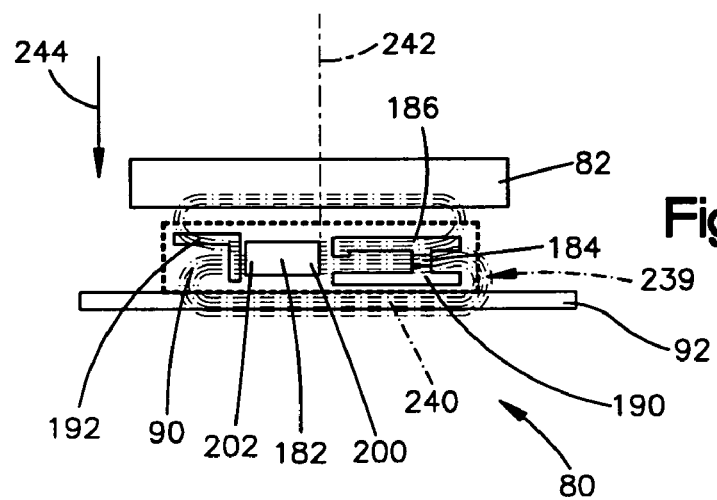
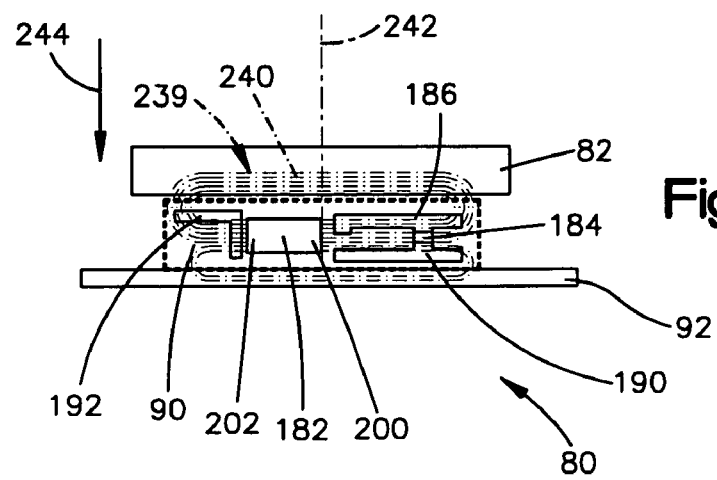

APPARATUS FOR SENSING THE PROXIMITY OF A VEHICLE TO AN OBJECT

TECHNICAL FIELD

The present invention relates to an apparatus for sensing the proximity of a vehicle to an object.

BACKGROUND OF THE INVENTION

There are several systems that warn a vehicle driver of an impending collision. One of these systems involves providing proximity sensors on a first vehicle to detect a second vehicle or other object. These sensors are typically infrared, radar, or ultrasonic sensors. The systems that utilize these sensors are generally costly.

SUMMARY OF THE INVENTION

The present invention relates to an apparatus for sensing the proximity of a first vehicle to an object, such as a second vehicle. The apparatus includes an array of sensors mounted on the first vehicle. The sensors include Hall effect sensors. The array of sensors provide an output signal when the sensors are located within the proximity of the second vehicle.

BRIEF DESCRIPTION OF THE DRAWINGS

The foregoing and other features of the invention will become more apparent to one skilled in the art upon consideration of the following description of the invention and the accompanying drawings in which:

FIG. 2 is an exploded perspective view illustrating a sensor assembly of FIG. 1;

FIG. 3 is a perspective view of the sensor assembly of FIG. 2 in an assembled condition;

FIGS. 7A–7C are schematic views illustrating the sensor arrangement of FIG. 6 in different conditions;

DESCRIPTION OF AN EMBODIMENT

Figure 1:
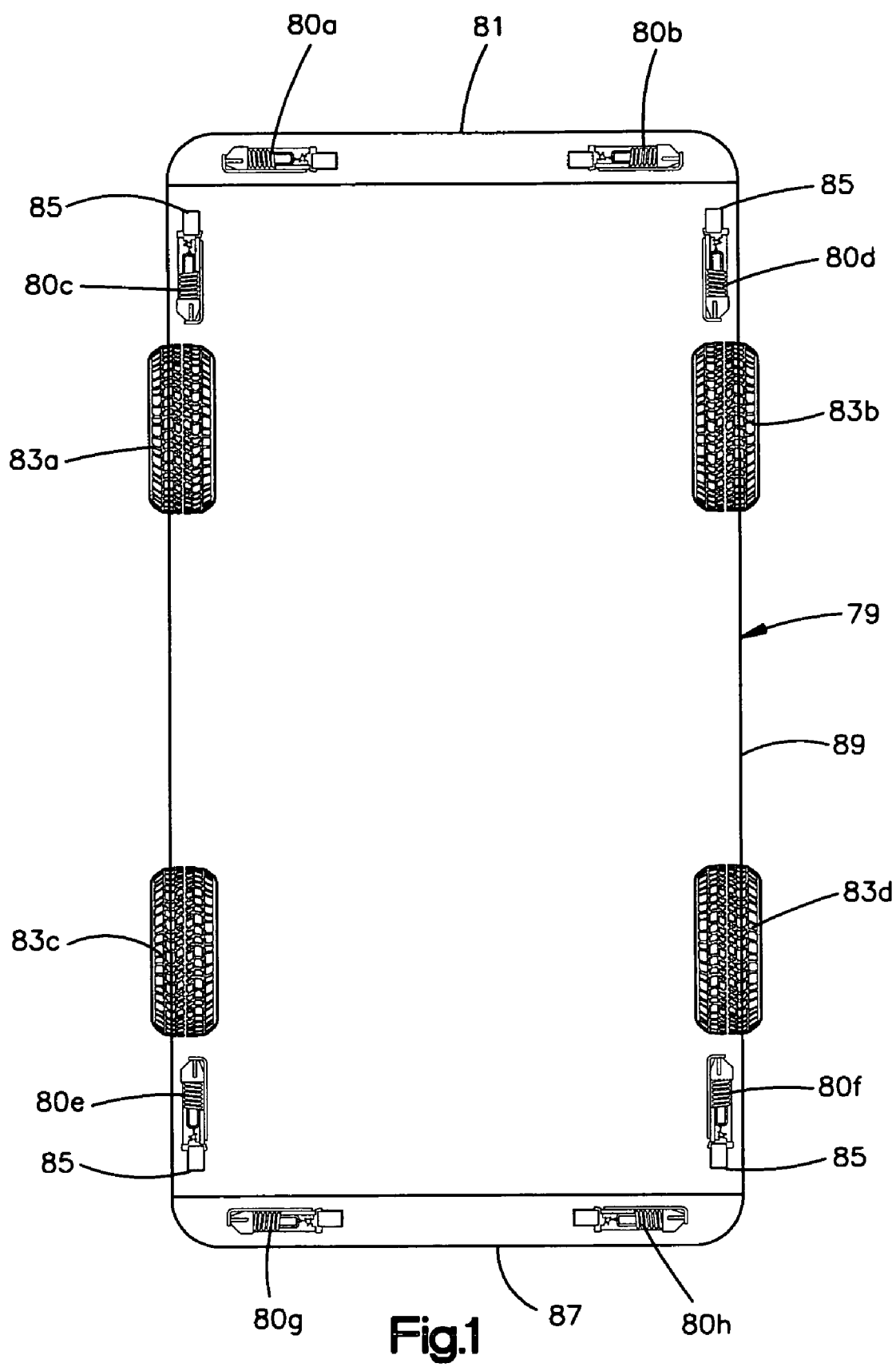
FIG. 1 is a schematic representation of proximity sensor assemblies arranged in strategic positions on a vehicle according to the present invention.
Figure 4:
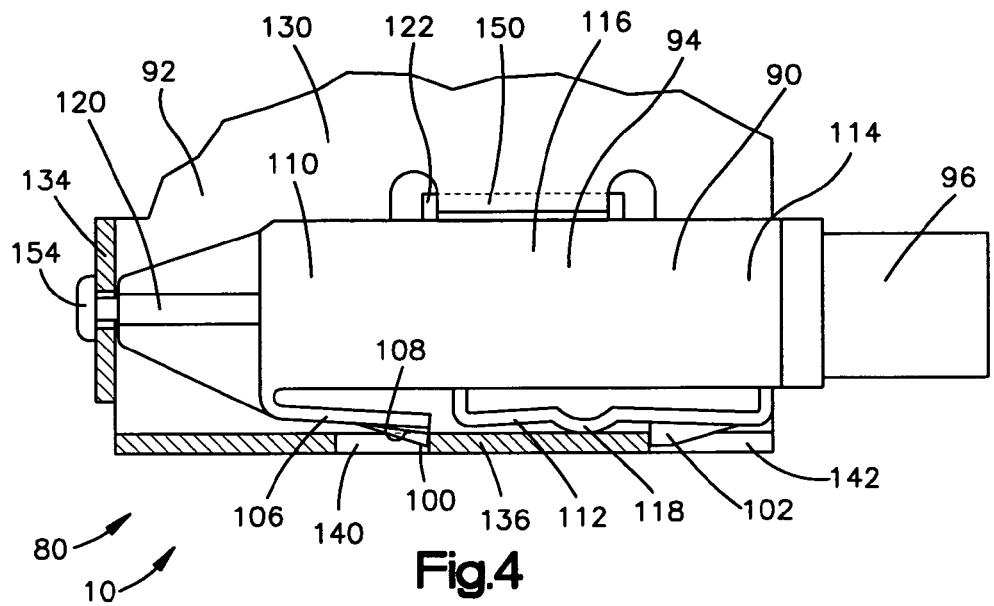
FIG. 4 is a partial sectional view taken generally along line 4—4 in FIG. 3.

FIG. 1 illustrates proximity sensor assemblies 80a–80h arranged in strategic positions on a vehicle 79 for detecting vehicles or other objects. Specifically, proximity sensor assembly 80a is mounted inside a non-ferrous front bumper 81 and located on the left or driver's side of the vehicle 79. Proximity sensor assembly 80b is mounted inside the front bumper 81 and located on the right or passenger's side of the vehicle 79. Proximity sensor 80g is mounted inside a non-ferrous rear bumper 87 and located on the left side of the vehicle 79. Proximity sensor 80h is mounted inside the non-ferrous rear bumper 87 and located on the right side of the vehicle 79.

Proximity sensor assemblies 80c, 80d, 80e, and 80f are mounted within slots 85 formed in a body 89 of the vehicle 79. In particular, proximity sensor assembly 80c is located on the left side of the vehicle 79 between a left front tire 83a and the front bumper 81. Proximity sensor assembly 80d is located on the right side of the vehicle 79 between a right front tire 83b and the front bumper 81. Proximity sensor assembly 80e is located on the left side of the vehicle 79 between a left rear tire 83c and the rear bumper 87, and proximity sensor assembly 80f is located on the right side of the vehicle 79 between a right rear tire 83d and the rear bumper 87. It will be appreciated that the proximity sensor assemblies 80 can be mounted in other locations of the vehicle 79.

Referring to FIGS. 2–5, the sensor assemblies 80 are used to detect a potential colliding object 82. The object 82 is generally composed of a ferrous material and can take the form of another vehicle as shown in the figures. The object 82 can also take the form of another potential colliding object such as a guard rail or steel pole.

Each of the sensor assemblies 80 includes a sensor 90 and a bracket 92. The sensor 90 includes a housing 94 that supports sensor components (not shown in FIGS. 2–5) that will be described in further detail below. The housing 94 may be constructed of any suitable material, such as molded plastic. The sensor 90 also includes a connector portion 96 for providing an electrical connection between the sensor 90 and vehicle electronics, which will be described herein below.

The housing 94 and the bracket 92 are configured to cooperate with each other to provide a releasable connection between the sensor 90 and the bracket. The housing 94 includes first and second latch members 100 and 102, respectively, that project away from a first surface 104 of the housing. The first latch member 100 is fixed to a cantilever spring arm 106 that projects from the first surface 104 at a leading end 110 of the sensor 90. The cantilever spring arm 106 includes a projection 108 positioned adjacent the first latch member 100. The second latch member 102 is fixed to a dually constrained spring arm 112 that has opposite ends that project from the first surface 104 at a trailing end 114 and mid-section 116 of the housing 94. The dually constrained spring arm 112 includes a centrally located projection 118.

Figure 5:
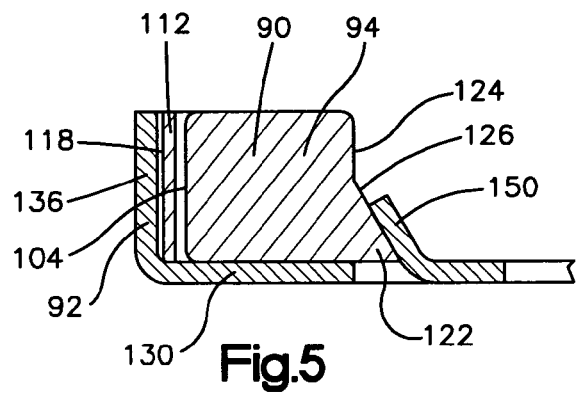
FIG. 5 is a partial sectional view taken generally along line 5—5 in FIG. 3.

The housing 94 also includes a fastener receiving portion 120 that projects from the leading end 110 of the housing. Referring to FIG. 5, the housing 94 also includes a ramp portion 122 that projects from a second surface 124 of the housing, opposite the first surface 104. The ramp portion 122 has an angled surface 126 that extends at an acute angle relative to the second surface 124.

Referring to FIGS. 2–5, the bracket 92 includes a base portion 130 that includes a fastener aperture 132 for receiving a fastener, such as a bolt (not shown) for connecting the bracket, and thus the sensor assembly 80, to a mounting location, such as within the body of a vehicle (see FIG. 1). The bracket 92 also includes a fastener flange 134 and a support flange 136 that extend perpendicularly from the base portion 130. The bracket 92 further includes a ramp portion 150 that extends at an acute angle from the base portion 130.

The support flange 136 includes first and second latch receiving portions 140 and 142, respectively. The first latch receiving portion 140 comprises an aperture that extends through the support flange 136. The second latch receiving portion 142 comprises a recess that extends into the support flange 136 from a rear edge of the support flange. The support flange 136 may also include a recess 144 that extends into the support flange from an upper edge of the support flange.

To assemble the sensor 90 and the bracket 92 in order to form the sensor assembly 80, the sensor and bracket are arranged as shown in FIG. 2 and the sensor is moved along an axis 152 into the bracket. As best shown in FIG. 5, as the sensor 90 is inserted into the bracket 92, the ramp portion 122 of the housing 94 engages and slides along the ramp portion 150 of the bracket. As shown in FIG. 5, the acute angles along which the ramp portions 122 and 150 are formed causes the surface 126 of the ramp portion 122 to form a mated engagement with the ramp portion 150.

Referring to FIGS. 2–5, as the sensor 90 is moved into the bracket 92, the cantilever spring arm 106 and the dually constrained spring arm 112 deflect to permit the first latch member 100 and the projection 118 to slide over the support flange 136. The first and second latch receiving portions 140 and 142 may be offset with each other so that the first latch member 100 does not engage the second latch receiving portion when the sensor 90 is initially moved into the bracket 92. When the sensor 90 moves beyond a predetermined point, the cantilever spring arm 106 biases the first latch member 100 into the first latch receiving portion 140. At this point, the second latch member 102 engages the second latch receiving portion 142. The first and second latch members 100 and 102 thus cooperate with the first and second latch receiving portions 140 and 142 to help block movement of the sensor 90 relative to the bracket 92 in directions along the axis 152.

While the first and second latch members 100 and 102 are engaged with the first and second latch receiving portions 140 and 142, the protrusions 108 and 118 engage the support flange 136 and the cantilever and dually constrained spring arms 106 and 112 bias the sensor 90 away from the support flange. This urges the surface 126 of the sensor ramp portion 122 into engagement with the ramp portion 150 of the bracket 92. The cantilever and dually constrained spring arms 106 and 112 and the ramp portions 122 and 150 thus cooperate to help block movement of the sensor 90 relative to the bracket 92 in directions transverse to the axis 152. For added security, a fastener 154 may be inserted through the aperture in the fastener flange 134 and into the fastener portion 120 of the sensor 90 to thereby connect the sensor to the bracket 92.

To remove the sensor 90 from the bracket 92, one simply removes the fastener 154, if present, and moves the first latch member 100 out of the first latch receiving portion 140 by depressing the first latch member against the bias of the cantilever spring arm 106. The dually constrained spring arm 112 may be accessed through the recess 144 and may also be depressed against its spring bias in order to disengage the protrusion 118 from the support flange 136. The sensor 90 may then be slid along the axis 152 to remove the sensor from the bracket 92.

Figure 6:
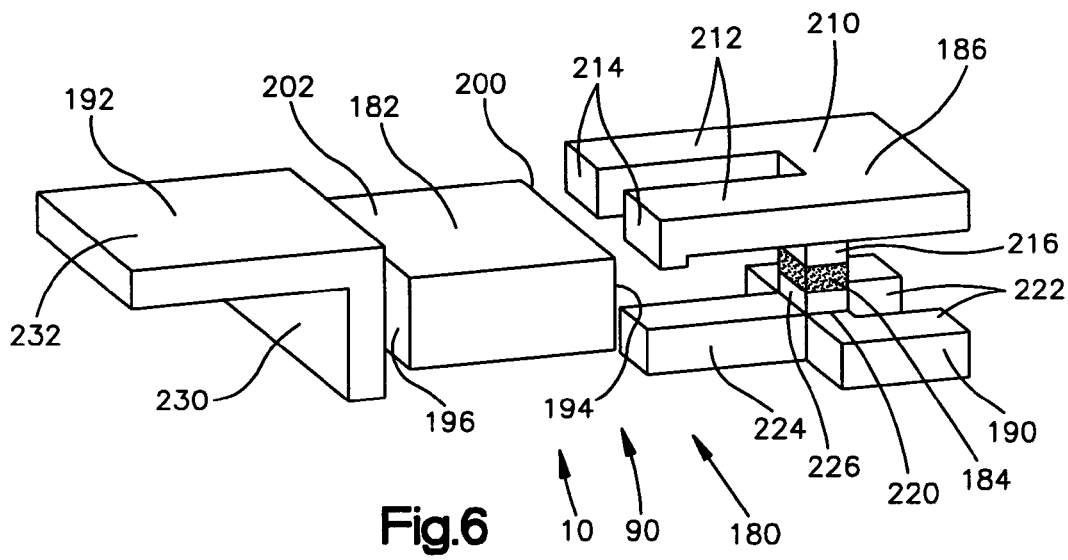
FIG. 6 is a schematic perspective view of a sensor arrangement of the sensor assembly of FIGS. 2–5.

Referring to FIG. 6, the sensor 90 includes components 180 that are packaged in the housing (not shown in FIG. 6). The components 180 may be supported in the housing by any suitable means, such as a press-fitting, an adhesive, by packaging the components using a potting material (e.g., an epoxy resin), or by a combination thereof. The components 180, when supported in the housing, are arranged in the general relative configuration shown in FIG. 6. Since FIG. 6 is a schematic illustration, minor details of the components 180 may have been omitted from FIG. 6 for clarity. This may not, however, affect the functionality of the sensor 90.

The components 180 include a permanent magnet 182, a Hall effect device 184, a ferromagnetic first or upper flux collector 186, a ferromagnetic second or lower flux collector 190, and a ferromagnetic third or return flux collector 192. The Hall effect device 184 is sandwiched between the upper and lower flux collectors 186 and 190. The magnet 182 has opposite poles 200 and 202 at opposite ends of the magnet. The upper flux collector 186, lower flux collector 190 and Hall effect device 184 are positioned adjacent the pole 200 of the magnet 182. The return flux collector 192 is positioned adjacent the pole 202 of the magnet 182.

The upper flux collector 186 has a generally U-shaped configuration with a base portion 210 and a portion bifurcated to provide spaced parallel leg portions 212 that extend from the base portion. The leg portions 212 terminate with an enlarged portion 214 spaced close to a first end surface 194 and the pole 200 of the magnet 182. The upper flux collector 186 also includes a support portion 216 that protrudes from the base portion 210 at a position near the intersection of the leg portions 212 and the base portions. The support portion 216 is positioned close to or in abutting engagement with the Hall effect device 184.

The lower flux collector 190 has a generally Y-shaped configuration with a base portion 220 and a portion bifurcated to provide spaced parallel first leg portions 222 that extend from the base portion away form the magnet 182. A second leg portion 224 extends from the base portion 220 in a direction opposite the first leg portions 222 and terminates spaced close to the first end surface 194 and pole 200 of the magnet 182. The lower flux collector 190 also includes a support portion 226 that protrudes from the base portion 220 at a position near the intersection of the first and second leg portions 222 and 224. The support portion 226 is positioned close to or in abutting engagement with the Hall effect device 184. The Hall effect device 184 is thus sandwiched between the support portions 216 and 226 of the upper and lower flux collectors 186 and 190.

The return flux collector 192 has a generally L-shaped configuration with a first leg portion 230 that is positioned spaced close to a second end surface 196, opposite the first end surface 194, and the pole 202 of the magnet 182. The first leg portion 230 extends generally parallel to a second end surface 196 of the magnet 182. A second leg portion 232 extends perpendicularly from the first leg portion 230 in a direction away from the magnet 182.

The Hall effect device 184 is an integrated circuit that has an output that changes in response to changes in the flux density of a magnetic field acting on a Hall effect transducer. In the embodiment illustrated in FIGS. 1–6, the hall effect device 184 is a bipolar Hall effect device. Such bipolar Hall effect devices are actuatable between two discrete conditions based on the flux density of a magnetic field acting on the Hall effect device. For example, a bipolar Hall effect device may have an "off" condition and a corresponding output when a magnetic field of a flux density below a predetermined level acts on the device. This bipolar Hall effect device may also be actuated to an "on" condition with a corresponding output when a magnetic field of a flux density at or above the predetermined level acts on the device. Alternatively or conversely, a bipolar Hall effect device may have an "on" condition when a magnetic field of a flux density below a predetermined level acts on the device. This bipolar Hall effect device may also be actuated to an "off" condition when a magnetic field of a flux density at or above the predetermined level acts on the device.

Referring to FIGS. 7A–7C, when the sensor assembly 80 is installed in the vehicle, the sensor 90 is placed in the above described position relative to the body (not shown in FIGS. 7A–7C). In this position, magnetic flux is conducted between the poles 200 and 202 of the magnet 182 through a flux path that is dictated by a variety of factors. The upper flux collector 186, lower flux collector 190, and return flux collector 192, along with the bracket 92 and the surrounding ferromagnetic components of the vehicle all may help define this flux path.

As shown in FIG. 7A, the flux collectors 186, 190, and 192 form parallel flux paths through which magnetic flux may flow between the poles 200 and 202 of the magnet 182. This is achieved, at least in part, as a result of the configuration of the upper flux collector 186, lower flux collector 190, and return flux collector 192.

Referring to FIG. 6 in combination with FIG. 7A, the space between the leg portions 212 of the upper flux collector 186 is aligned vertically with the second leg portion 224 of the lower flux collector 190. This helps prevent flux leakage between the upper and lower flux collectors 186 and 190. The base portion 210 and the second leg portions 222 help prevent flux leakage to adjacent ferromagnetic parts of the vehicle. The support portions 216 and 226 help concentrate magnetic flux on the Hall effect device 184.

The return flux collector 192 provides a low reluctance path for conducting return flux to the pole 202 of the magnet 182. The return flux collector 192 may also help reduce the reluctance of the magnetic flux path through the vehicle 82. As shown in FIG. 7A, the bracket 92, being in abutting engagement with the sensor 90, may also help provide the low reluctance flux path between the poles 200 and 202.

The flux path 239 is indicated generally by flux lines identified generally at 240 in FIGS. 7A–7C. The flux lines 240 may also be indicative of the flux density of the magnetic field of the magnet 182. For purposes of simplicity in illustration, the flux lines 240 are illustrated in FIGS. 7A–7C as extending between the magnet poles 200 and 202 in a manner that may be more even and uniform than actual. Those skilled in the art, however, will appreciate that the flux lines 240 may extend in a more uneven and/or non-uniform manner. For purposes of illustration, however, the flux lines 240 of FIGS. 7A–7C are sufficient to show how the flux path varies as the ferromagnetic surroundings of the sensor 90 change. Also, for purposes of simplicity in illustration, the flux lines illustrated in FIGS. 7A–7C extend a distance out that is smaller than their actual distance.

In FIGS. 7A–7C, the object 82 in the form of a vehicle approaches the vehicle 79, which contains the sensor 90, along a path of travel illustrated generally at 242. The path 242 extends adjacent the sensor 90. With reference to the embodiment illustrated in FIGS. 7A–7C, the sensor 90 will be described herein as being used to detect the approaching vehicle 82. The direction of the vehicle 82 approaching the sensor 90 is indicated generally by the arrow labeled 244 in FIGS. 7A–7C.

As the vehicle 82 approaches the vehicle 79 along the path 242, the vehicle 82 may become positioned in close proximity to the sensor 90. The vehicle 82, when positioned near the sensor 90, affects the flux path 239. The vehicle 82, being constructed of a ferromagnetic material, attracts the magnetic field produced by the magnet 182, which alters the flux path 239. The degree to which the vehicle 82 alters the flux path 239 depends at least partially on the size, i.e., the mass or volume, of the portion of the vehicle 82 positioned adjacent the magnet 182. As a result, the flux density acting on the Hall effect device 184 may vary in response to the position of the vehicle 82 relative to the sensor 90.

As shown in FIG. 7A, when the vehicle 82 is positioned more than a predetermined distance from the sensor 90, the vehicle 82 has little or no effect on the flux path 239. The predetermined distance is set by the sensor 90 to be the maximum distance between the vehicles 79, 82 in which they are in danger of colliding with each other. Alternatively, the predetermined distance can be set at other distances from the vehicle based on other criteria. In this condition, the bracket 92 forms a relatively large ferromagnetic mass adjacent and beneath the sensor 90. In this condition too, the flux path 239 extends largely through the lower flux collector 190, bracket 92, and return flux collector 192. When the vehicle 82 is in this position, the magnetic field acting on the Hall effect device 184 may have a relatively high flux density. The Hall effect device 184 may thus have a corresponding condition, such as a "high" or "on" condition with a corresponding output.

Referring to FIG. 7B, as the vehicle approaches the sensor 90 in the direction 244, the vehicle 82 begins to move into the vicinity of the sensor 90 and begins to alter the flux path 239 between the poles 200 and 202 of the magnet 182. This is indicated by the flux lines 240 of FIG. 7B, which are drawn toward the vehicle 82. This may begin to alter the flux density of the magnetic field acting on the Hall effect device 184. This alteration may not, however, be of a magnitude sufficient to effectuate a change in the state of the Hall effect device 184.

Referring to FIG. 7C, as the vehicle 82 moves further in the direction 244, the vehicle 82 moves to a position adjacent the sensor 90. The vehicle 82 has a relatively large cross-sectional area and thus comprises a large ferromagnetic mass adjacent the sensor 90, which causes a significant alteration of the flux path between the poles 200 and 202. This is indicated by the flux lines 240 of FIG. 7C. This change in the flux path alters the flux density of the magnetic field acting on the Hall effect device 184 to an extent sufficient to effectuate a change in the state of the Hall effect device.

The flux path 239 is drawn from the magnet 182 through the upper flux collector 186 and to the vehicle 82. The flux path 239 continues through the vehicle 82 to the return flux collector 192 and back to the magnet 182. The direction of the flux flow between the poles 200 and 202 depends on the polarization of the poles. The upper flux collector 186 extends parallel and close to the vehicle 82 and is positioned close to the pole 200 of the magnet 182. The return flux collector 192 extends parallel and close to the vehicle 82 and is positioned close to the pole 202 of the magnet 182. The upper flux collector 186, return flux collector 192, and vehicle 82 thus provide a low reluctance path between the poles 200 and 202 of the magnet 182 when the apparatus 10 is in the condition of FIG. 7C.

When the apparatus 10 is placed in the condition of FIG. 7C, the vehicle 82 moves to a position relative to the sensor assembly 80 that effectuates a change in the state of the Hall effect device 184. When the vehicle 82 is in this position, the magnetic field acting on the Hall effect device 184 may have a relatively low flux density. The Hall effect device 184 may thus have a corresponding condition, such as a "low" or "off" condition with a corresponding output. This change of state in the Hall effect device 184 is thus indicative of the vehicle 82 being positioned at the predetermined position distance from the sensor assembly 80.

Alternatively, it should be apparent that the vehicle 79 with the sensor assembly 80 could be approaching the vehicle 82 instead of the vehicle 82 approaching the vehicle. However, the principal of operation of the sensor assembly 80 and vehicle 82 for this situation would be the same as that for the vehicle 82 approaching the vehicle 79.

Depicted schematically in FIG. 2, the output signal from the sensor assembly 80, i.e., the Hall effect device 184, is directed to a controller 251. The controller 251 may comprise a microcomputer, an integrated circuit, a plurality of discrete components or a combination of integrated circuits and discrete components configured to provide desired functions. The controller 251 is electrically coupled to an indicator 252 such as a visual or audible device that warns the driver that his vehicle 79 is in danger of colliding with the vehicle 82. One such visual device can be, for example, a light located on the dashboard of the vehicle 79.

The controller 251 utilizes the output signal from the sensor assembly 80 to control the actuation of the indicator 252. For example, when the output signal of the sensor assembly 80 indicates that the sensor assembly 80 is at or within the predetermined distance from the vehicle 82, the controller 251 may actuate the indicator 252.

Those skilled in the art will appreciate that the configuration of the apparatus may depart from that disclosed in the illustrated embodiment without departing from the spirit of the present invention. For example, in the illustrated embodiment, the apparatus 10 is configured such that the vehicle 82 reduces the flux density of the magnetic field acting on the Hall effect device 184 as the vehicle 82 moves in close proximity to the sensor assembly 80. The apparatus 10 could, however, be configured such that the flux density of the magnetic field acting on the Hall effect device 184 increases as the vehicle 82 moves in close proximity to the sensor 80.

In the illustrated embodiment, the vehicle 82 alters the flux path of the magnetic field to attract the field away from the Hall effect device 184. The apparatus 10 could, however, be configured such that the vehicle 82 alters the flux path 239 of the magnetic field to attract the field toward the Hall effect device 184.

As a further example, instead of being bipolar, the Hall effect device 184 of the present invention could be a ratiometric Hall effect device. A ratiometric Hall effect device has an output signal that varies as a function of the flux density of the magnetic field acting on the Hall effect device. The output signal of the ratiometric Hall effect device could be implemented in a circuit that is configured such that the current or voltage of the output signal varies as a function of the flux density of the magnetic field acting on the Hall effect device. Such a ratiometric Hall effect device may be used in the sensor configuration of the present invention to provide a signal that varies as a function of distance between the sensor assembly 80 and vehicle 82 instead of an "on/off" signal indicative of whether the vehicle 82 is at or within the predetermined distance from the sensor assembly 80. In this configuration, the sensor would provide a variable signal indicative of actual distance between the sensor assembly 80 and vehicle 82 instead of a discrete signal indicative of the vehicle 82 being at or within the predetermined distance from the sensor assembly 80.

Figure 8:
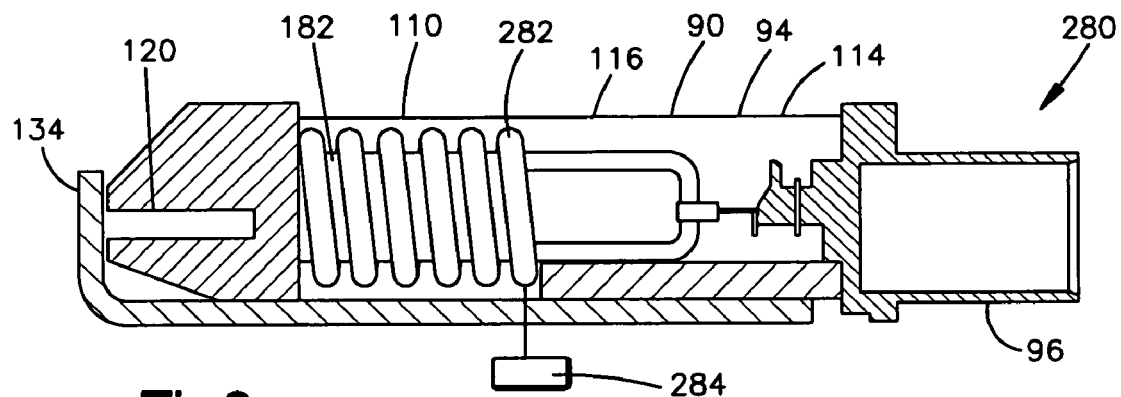
FIG. 8 is a cross sectional view of an alternate proximity sensor assembly.

FIG. 8 depicts an alternative sensor assembly 280 that adjusts the sensing range. Elements of the sensor assembly 280 that are similar to those of the sensor assembly 80 of FIGS. 2–7C will have the same reference numbers. This sensor assembly 280 includes a cylindrical electromagnetic coil 282 that is wound around the magnet 182 and acts as a second source of magnetic flux. Voltage is supplied to the coil 282 by a power source such as a vehicle battery. A voltage adjusting device 284, such as a potentiometer, is coupled to the coil 282 and power source. A user, such as the vehicle driver, operates the voltage adjusting device 284 to control the amount of voltage across to the coil 282.

The coil 282 acts upon the magnet to generate additional magnetic flux based on the amount of voltage flowing across the coil 282. This additional magnetic flux allows the flux lines to extend further out from the sensor 280 and thereby increase the sensing range of the sensor assembly 280 or the distance that the sensor assembly 280 can sense the vehicle 82. To increase the sensing range of the sensor assembly 280, a user operates the voltage adjusting device 284 to supply more voltage to the coil 282. To decrease the sensing range of the sensor assembly 280, a user operates the voltage adjusting device 284 to supply less voltage to the coil 282. In all other aspects, the sensor assembly 280 is similar to the previously mentioned sensor assembly 80.

Figure 9:
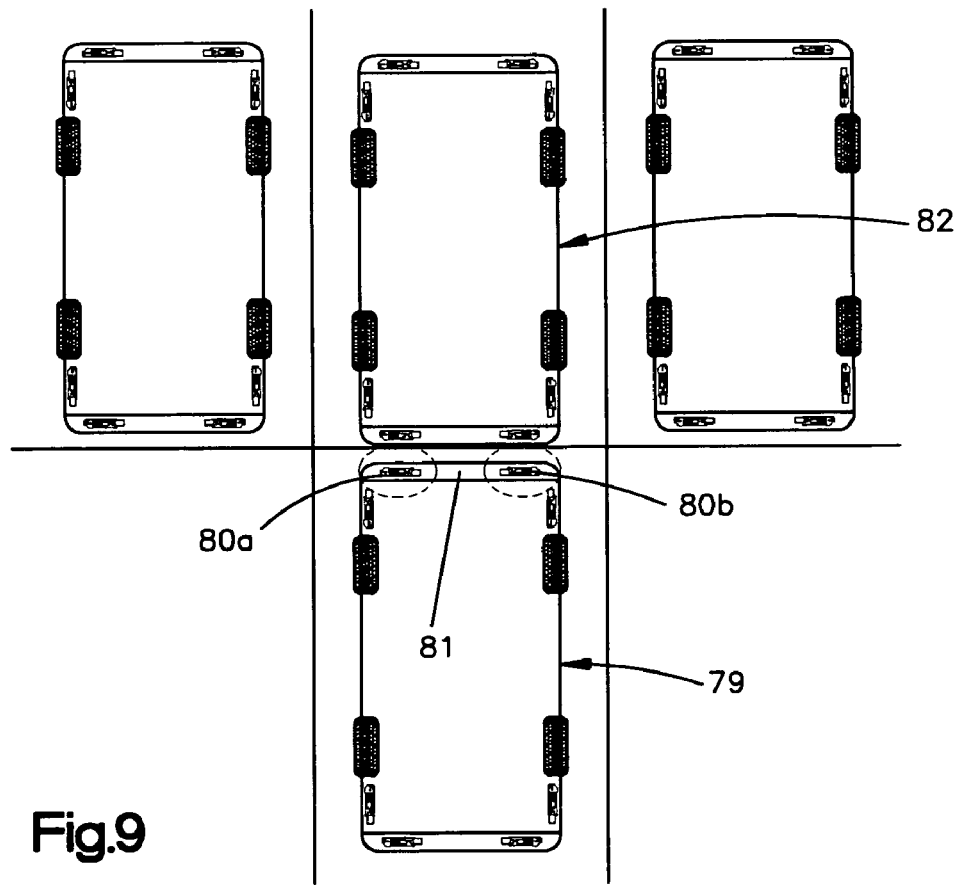
FIG. 9 is a schematic representation of vehicles in a typical parking lot in which one of the vehicles has two of its proximity sensor assemblies detecting another vehicle.

FIG. 9 is a schematic representation of vehicles in a typical parking lot in which the vehicle 79, while parking, has two of its proximity sensor assemblies 80*a* and 80*b* detecting a parked vehicle 82. In particular, the proximity sensor assemblies 80*a* and 80*b* caused the controller 251 to actuate the indicator 252 when the front bumper 81 of the vehicle 79 moved to a position dangerously close to the parked vehicle 82 located forwardly adjacent the parking space of the parking vehicle 79.

Figure 10:
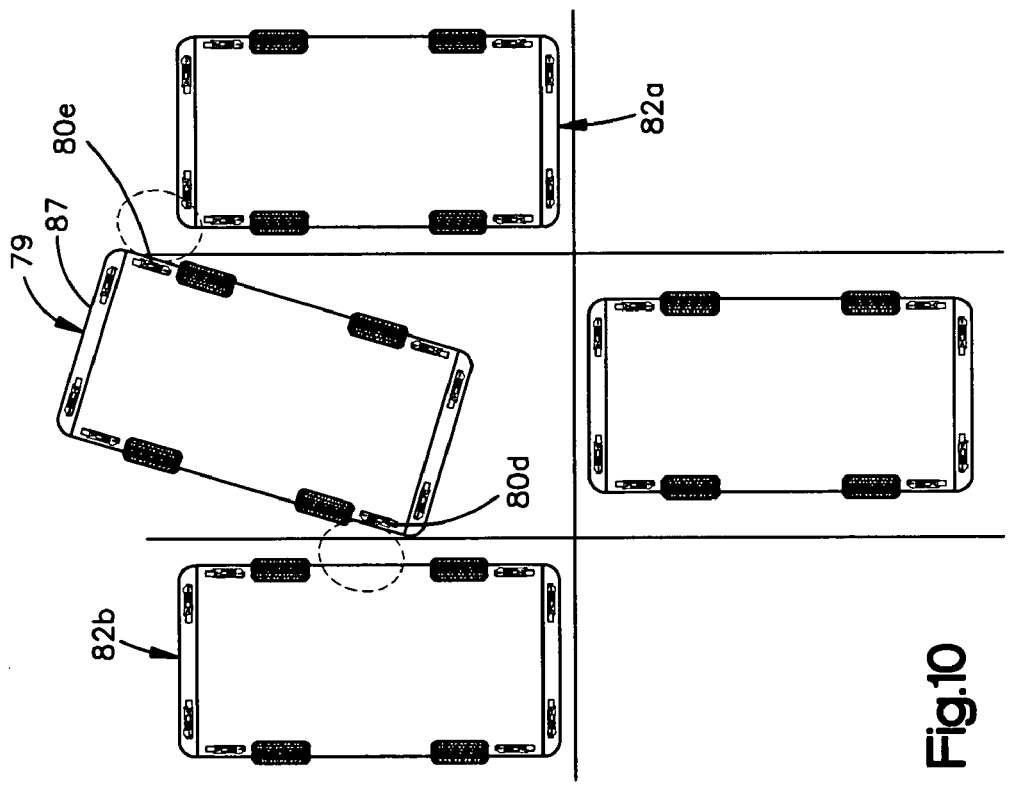
FIG. 10 is a schematic representation of vehicles in a typical parking lot in which one of the vehicles has two of its proximity sensor assemblies detecting adjacent vehicles.

FIG. 10 is a schematic representation of vehicles in a typical parking lot showing the vehicle 79 backing out of a parking space with two of its proximity sensor assemblies 80*e* and 80*d* detecting adjacent parked vehicles 82*a* and 82*b*. The proximity sensor assembly 80*e* caused the controller 251 to actuate the indicator 252 when the exiting vehicle 79 turned sharply left and moved to a position dangerously close to the parked vehicle 82*a* located adjacent the left side of the exiting vehicle 79. The proximity sensor assembly 80*d* also caused the controller 251 to actuate the indicator 252 during the same maneuver when the exiting vehicle 79 moved to a position dangerously close to the parked vehicle 82*b* located adjacent the right side of the exiting vehicle 79.

Figure 11:
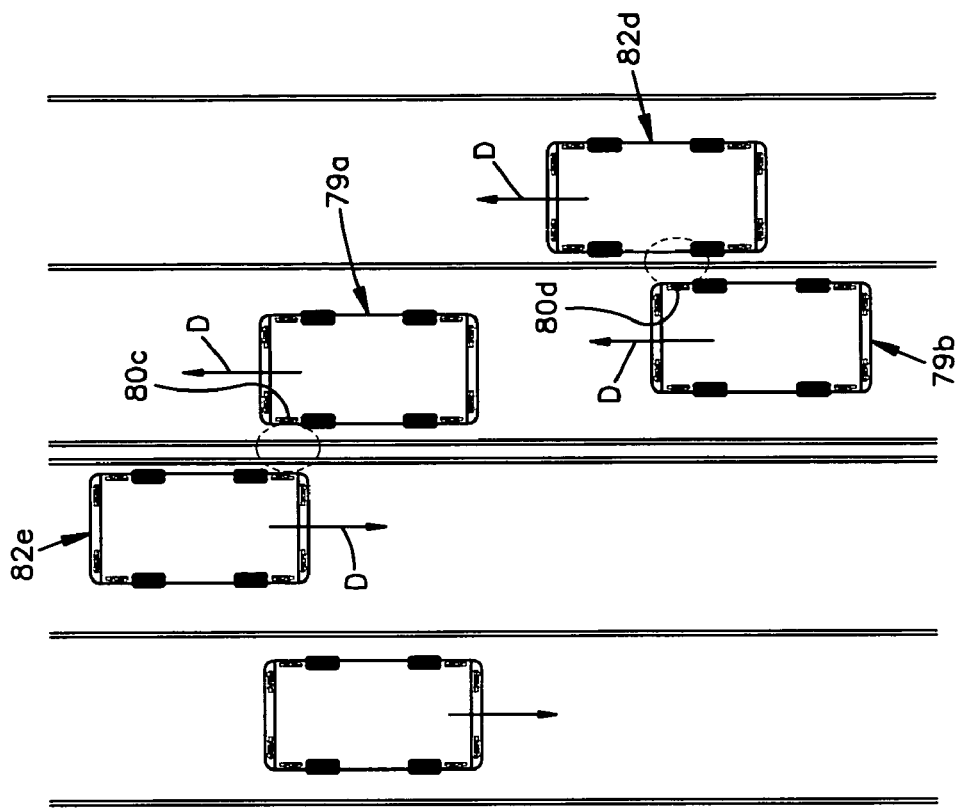
FIG. 11 is a schematic representation of vehicles traveling in opposite and neighboring lanes in which two of the vehicles each has its proximity sensor assembly detecting a vehicle in the adjacent lane.

FIG. 11 is a schematic representation of vehicles in adjacent lanes traveling in directions indicated by the arrows D. Two of the vehicles 79*a*, 79*b* each has its proximity sensor assembly detecting a vehicle in its adjacent lane. The proximity sensor assembly 80*c* of the vehicle 79*a* caused the controller 251 to actuate the indicator 252 when the vehicle 79*a* moved to a position dangerously close to an oncoming vehicle 82*e* traveling in the opposite lane. The proximity sensor assembly 80*d* of the vehicle 79*b* caused the controller 251 to actuate the indicator 252 when the vehicle 79*b* moved to a position dangerously close to the vehicle 82*d* traveling in the same direction in the neighboring lane.

Other proximity sensor assemblies 80 can be used to detect vehicles or objects in other potential collision situations. For example, proximity sensor assemblies 80*g* and 80*h* can cause the controller 251 to actuate the indicator 252 when the vehicle 79 backs up to a position dangerously close to another vehicle or object located rearward of the vehicle 79.

From the above description of the invention, those skilled in the art will perceive improvements, changes and modifications. Such improvements, changes and modifications within the skill of the art are intended to be covered by the appended claims.

Having described the invention, the following is claimed:

1. An apparatus for sensing the proximity of a first vehicle to an object, said apparatus comprising:
   an array of sensors mounted on said first vehicle, said sensors comprising Hall effect sensors; and
   said array of sensors providing an output signal when located within the proximity of said object, each sensor includes an adjusting device for adjusting the sensing range of said sensor, wherein said sensor includes a magnet, an electromagnetic coil wound around said magnet and operatively connected to said adjusting device, said adjusting device controlling the amount of voltage traveling across said coil, wherein the sensing range of said sensor is adjusted based on the amount of voltage traveling across said coil.

2. An apparatus for sensing the proximity of a first vehicle to an object, said apparatus comprising:
   an array of sensors mounted on said first vehicle, said sensors comprising Hall effect sensors; and
   said array of sensors providing an output signal when located within the proximity of said object, wherein said Hall effect sensor is responsive to a change in a magnetic field acting on said Hall effect sensor, a magnet for producing a magnetic field that acts on said Hall effect sensor, said second vehicle changing the magnetic field acting on said Hall effect sensor as the position of the second vehicle relative to the sensor changes, first and second flux collectors located on one side of said magnet for concentrating said magnetic field on said Hall effect sensor, and a third flux collector located on a second side of said magnet opposite said one side for reducing the reluctance of a magnetic flux path through the second vehicle.

3. The sensor recited in claim 2, wherein said first and second flux collectors are located adjacent a first pole of said magnet and said third flux collector is located adjacent a second pole of said magnet, opposite said first pole.

* * * * *